United States Patent
Dannoux et al.

(10) Patent No.: US 8,039,728 B2
(45) Date of Patent: Oct. 18, 2011

(54) GLASS-CERAMIC THERMOELECTRIC MODULE

(75) Inventors: Thierry Luc Alain Dannoux, Avon (FR); Paulo Gaspar Jorge Marques, Fontainebleau (FR)

(73) Assignee: Corning Incorporated, Corning, NY (US)

(*) Notice: Subject to any disclaimer, the term of this patent is extended or adjusted under 35 U.S.C. 154(b) by 67 days.

(21) Appl. No.: 12/070,072

(22) Filed: Feb. 15, 2008

(65) Prior Publication Data

US 2009/0025772 A1 Jan. 29, 2009

(30) Foreign Application Priority Data

Feb. 28, 2007 (EP) .................... 07300831

(51) Int. Cl.
*H01L 35/30* (2006.01)
*H01M 6/00* (2006.01)

(52) U.S. Cl. ........ 136/205; 136/203; 136/204; 136/208; 136/236.1; 136/237; 136/238; 29/632.2

(58) Field of Classification Search .................. 136/203, 136/204, 205, 208, 236.1, 237, 238
See application file for complete search history.

(56) References Cited

U.S. PATENT DOCUMENTS

| | | | | |
|---|---|---|---|---|
| 3,885,992 A | 5/1975 | Wilcox | ........... | 136/212 |
| 5,070,045 A * | 12/1991 | Comte et al. | ........... | 501/4 |
| 5,952,728 A | 9/1999 | Imanishi et al. | | |
| 6,225,550 B1 | 5/2001 | Hornbostel et al. | ........ | 136/236.1 |
| 6,872,879 B1 * | 3/2005 | Serras et al. | ........... | 136/205 |
| 7,359,605 B2 * | 4/2008 | Heitmann | ........... | 385/129 |
| 2001/0017152 A1 * | 8/2001 | Funahashi et al. | ........... | 136/238 |
| 2005/0016183 A1 | 1/2005 | Tateyama et al. | ........... | 62/3.7 |
| 2005/0211288 A1 | 9/2005 | Tateyama et al. | ........... | 136/212 |
| 2006/0157102 A1 * | 7/2006 | Nakajima et al. | ........... | 136/205 |

FOREIGN PATENT DOCUMENTS

| | | |
|---|---|---|
| EP | 1721880 | 2/2005 |
| EP | 1672709 | 9/2007 |
| JP | 2005129765 A | 5/2005 |

OTHER PUBLICATIONS

S. Urata et al.; "Power generation of p-type Ca3Co4O9/n-type CaMnO3 module"; 2006 International Conference on Thermoelectronics, 2006 IEEE pp. 501-504.
R. Funahashi et al.; "A portable thermoelectric-power-generating module composed of oxide devices"; Journal of Applied Physics 99, 066117 (2006) p. 066117-1-066117-3.
Terry J. Hendricks, PhD, PE; "Advanced Thermoelectric Energy Recovery Systems in Future Vehicle Systems"; DOE/EPRI High-Efficiency Thermoelectric Workshop, San Diego, CA Feb. 19, 2004; 32 Slides from Power Point Presentation.

* cited by examiner

*Primary Examiner* — Jennifer K. Michener
*Assistant Examiner* — Matthew Martin
(74) *Attorney, Agent, or Firm* — Walter M. Douglas

(57) ABSTRACT

The invention is directed to a thermoelectric module that utilizes a glass-ceramic material in place of the alumina and aluminum nitride that are commonly used in such modules. The glass-ceramic has a coefficient of thermal expansion of $<10 \times 10^{-7}/°$ C. The p- and n-type thermoelectric materials can be any type of such materials that can withstand an operating environment of up to 1000° C., and they should have a CTE comparable to that of the glass-ceramic. The module of the invention is used to convert the energy wasted in the exhaust heat of hydrocarbon fueled engines to electrical power.

13 Claims, 5 Drawing Sheets

Figure 7
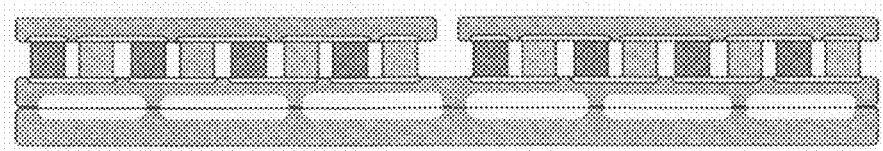
Figures 8A and 8B
Figure 8A
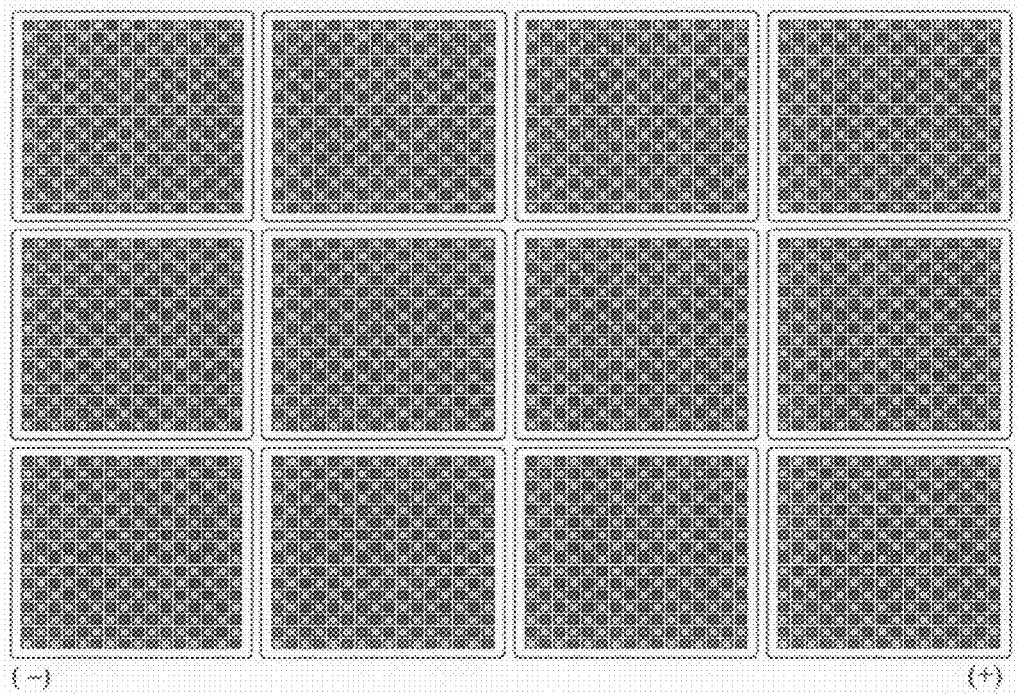
(−) (+)
Figure 8B
(−) (+)

GLASS-CERAMIC THERMOELECTRIC MODULE

CROSS-REFERENCE TO RELATED APPLICATIONS

This application claims the benefit of priority under 35 U.S.C. §119 of European Patent Application Serial No. 07300831.0 filed on Feb. 28, 2007.

FIELD

The invention is directed a thermoelectric module for converting heat to electrical power; and in particular to a thermoelectric module utilizing a glass-ceramic material having a very low coefficient of thermal expansion.

BACKGROUND

Thermoelectric materials are those in which when used in certain combinations, can convert heat into an electric current. While thermoelectric devices can be used for either cooling (when an electric current is supplied) or power generation (when exposed to hot and cold temperature sources), the present invention is directed to the second case—power generation.

Thermoelectric materials have the potential to greatly increase the efficiency of power systems that rely on hydrocarbon fuels (for example, coal, gasoline, diesel fuel, etc.) as energy sources. While various power generating thermoelectric devices have been proposed over the years, they have not found widespread utility, particularly for mobile applications such as cars and trucks, due to their low efficiency and high cost. In power generation application, for example automotive applications, one encounters high temperature gradient situations. Currently, approximately 75% of the energy obtained from the combustions of a fuel such as gasoline is wasted due to thermal and other losses, and only about 25% of the energy is utilized by the vehicle for either moving it or powering equipment and accessories. Broken down, of the 100% of the energy from the fuel, approximately 40% is lost in the exhaust gases and 30% is lost cooling (radiator). Of the remaining 30%, approximately 5% is lost to friction or is radiated; leaving a net of 25% that is used for vehicle operation—mobility and powering (electrically) equipment and accessories. Of the 25% used for vehicle operation, about 18% is used for actually moving the vehicle and 7% is used for powering the equipment and accessories such as climate control, active breaking systems, entertainment (CD, radio, electronic engine control and other electrical power consuming equipment.

Presently, the electrical power demand of vehicles is increasing and is typically from 1-5 kilowatts in current vehicles. However, there is a problem due to the fact that the electrical power presently generated by a vehicle is generated very inefficiently, the efficient being less than 20% in the best instances, including chemical to mechanical and electrical conversion. A thermoelectric recovery system would enhance the efficiency of hydrocarbon-power vehicles by utilizing a part of the presently wasted thermal energy for direct electrical power conversion and would save the mechanical energy of the vehicles that is now used, for example by an alternator. This would result in a net saving of the overall chemical energy supplied by combustion of the fuel. Some of the benefits that would be obtained from the use of a thermoelectric module would include a reduction in environmental $CO_2$, the ability to use lighter and less powerful engines due to decreased load on the engine to supply power, the use of smaller batteries because electrical power would be supplied from the thermoelectric module once the engine is started, and the ability to drop the need for certain equipment such as an alternator. The thermoelectric modules can be used in many different vehicular applications to increase the efficient of combustion engines, for example boats and airplanes as well as land vehicles, and they can also be used for non-mobile applications such as heating systems and emergency generators (small power units generally).

One of the problems with thermoelectric energy conversion is that it is not very efficient when there is a small thermal gradient, for example a gradient of 100-200 degrees Centigrade. The temperature range of from ambient to approximately 250° C. is the domain where most the presently existing thermoelectrical materials and devices operate, and they are generally only used in those situations where other, convention electrical generators are not preferred or cannot be used; for example, in satellites, pipelines, gas-line monitoring, and other others of similar nature where convention generators may present problems. In contrast, at higher temperature the thermoelectric efficiency rises in the Carnot cycle with the square of the thermal gradient (in degrees Kelvin, ° K).

The figure of merit ($K^{-1}$) of thermoelectric materials is usually defined as:

$$Z=S2\sigma/\kappa=S^2//\rho\kappa=PF/\kappa$$

where:
S is the Seebeck coefficient or thermopower (usually in $\mu V/K$)
$\sigma$ is the electrical conductivity (in $S.cm^{-1}$),
$\rho$ is the electrical resistivity (in $\Omega.cm$),
$\kappa$ is the total thermal conductivity (in $W.cm^{-1}.K^{-1}$), and
PF is the electronic component or power factor (in $W.K^{-2}.m^{-1}$).

Since Z varies with temperature, thermoelectric materials ("TE") materials are best rated by a dimensionless figure of merit, ZT, where T is temperature in K. Good TE materials have low thermal conductivity (e.g., phonon glasses), high electrical conductivity (e.g., electronic crystals), and high thermopower. However, these properties are difficult to optimize simultaneously in a specific material since the three parameters in Z are not independent. In general, as S increases, so does $\rho$.

The ideal maximum output power P of a module is given by the expression:

$$P=(S \cdot \Delta T)^2/(4\rho L)$$

where $\Delta T = T_{hot} - T_{cold}$ is the difference of temperature between the hot and cold sources, and L is the length of the TE leg.

In conventional architecture, the choice of material for the electrode plate is led by electrical, thermal and thermo-mechanical considerations. That is, the material should be able to withstand high temperatures (resistance to creep and oxidation) and also achieve good heat transfer. The material should also be matched to electrode and TE elements, and be a good electrical insulator in order to prevent any circuit shortcut. Currently, alumina ($Al_2O_3$) and aluminum nitride (AlN) are generally favored as the plate materials. FIG. 1 illustrates a simplified drawing of a conventional thermoelectric module 10 utilizing materials such as alumina and aluminum nitride. $Q_H$ and $Q_C$ represent the heat input and output flows; $T_{sh}$ and $T_{sc}$ represent the hot source temperature and cold source temperature, respectively; $\Delta V_{oc}$ is the voltage differential; $\alpha$ is a constant, and elements 12 are electric insulating layers.

The present invention is directed to solving the problem that in high temperature gradient applications, the present materials used for the electrode plate are exposed to severe thermal cycling (e.g. ranging from 50° to 850° C.) and are likely to create a prohibitive thermal expansion mismatch (see FIG. 2, right side). As a consequence of the thermal mismatch failures are likely to appear as shown in the right side of FIG. 2 which represents conventional thermoelectric module architecture 10. The left side of the dashed line represents the structure at room temperature, without any thermal gradient between the top and bottom of the Figure. The right side of the dashed line represents the same structure under an 800° C. thermal gradient when mismatched elements are used. For example, for a 50 mm large module, an 850° C. temperature gradient generates a 150 µm mismatch between the hot and cold alumina plate, presenting an 80× $10^{-7}$/° C. CTE. Several complex architectures have been proposed to that fundamental problem as is disclosed by Tateyama et al., US 2005/0016183 A1 and US 2005/0211288 A1 (assigned to Kabushiki Kaisha Toshiba). The present invention offers a material solution preventing destructive high temperature mismatch between thermoelectric module hot and cold source.

SUMMARY

The invention is directed to a thermoelectric module for generating electrical energy from a hot gaseous heat source, said module having a glass-ceramic first (top) substrate and a second (bottom) substrate; a ductile conductor as an electrical conductor (electrode) that can survive exposure to temperatures of up to approximately 1000° C. (for example, silver gold, platinum, palladium, platinum/palladium alloys, and silver coated copper or nickel electrodes and other materials that can survive exposure to temperatures up to approximately 1000° C.) in contact with said substrates; and one or a plurality of pairs of p- and n-type materials in contact with the electrodes of the first substrate and the second substrate; wherein when one side of the module is subjected to and in contact with a heat source and the other side of said module is subjected to and in contact with a cooling source, electrical power is generated by conversion of heat energy from said hot gaseous heat source to electrical energy by heat transfer from said hot gaseous heat source to said pairs p- and n-type materials which thereby convert said heat energy to electrical energy; and electrical leads from the thermoelectrical module to an electrical storage device (for example, a battery, an alternator) or, with appropriate conversion equipment, directly to an electricity consuming device. The glass-ceramic substrate has a coefficient of thermal expansion ("CTE") of $<10 \times 10^{-7}$/° C. at temperatures in the range of 20-700° C. In one embodiment the CTE is $<5 \times 10^{-7}$/° C. at temperatures in the range of 20-700° C. In a further embodiment the CTE is $<5 \times 10^{-7}$/° C. at temperatures in the range of 20-700° C.

In another aspect the invention is directed to a thermoelectric module having a glass-ceramic first and a second substrate; silver electrodes in contact with said substrates, and one or a plurality of pairs of p- and n-type materials in contact with the electrodes of the first substrate and the bottom substrate; wherein when one side of the module is subjected to and in contact with a heat source and the other side of said module is subjected to and in contact with a cooling source (the cooling side), electrical power is generated by conversion of heat energy from said hot gaseous heat source to electrical energy by heat transfer from said hot gaseous heat source to said pairs of p- and n-type materials which thereby convert said heat energy to electrical energy, and electrical leads from the thermoelectrical module to an electrical device; and further wherein said the cooling side is integrated into the thermoelectrical module such that cooling fluid from a fluid source is passed through openings within the cooling side of the module.

In another aspect the invention is directed to a method for making a glass-ceramic thermoelectric module, the method comprising the steps of preparing a first and a second glass substrate; forming a cavity on one side of each of said first and second substrates; ceramming the glass substrates having the cavities to form a glass-ceramic substrate having the cavities; placing an electrode material or a material that can be converted into an electrode material, for example, a silver or gold paste, in the cavity of each of the first and second substrates; and placing p- and n-type thermoelectric elements in contact with the electrode material in each of said first and second glass-ceramic substrates; sealing the first and second substrates together with a sealing agent (for example, an inorganic binder or devitrifying frit) to form a thermoelectric module in which the p- and n-type thermoelectric elements and electrode material are within the sealed module; heating the sealed module when to cure the electrode material, when necessary, to form electrodes and/or seal to electrodes within the module; and placing electrical leads in contact with the module to conduct electricity generated by the module to an electrical storage device.

In a further embodiment, the invention is directed to a method for making a glass-ceramic thermoelectric module, the method comprising the steps of preparing first and second glass substrate; forming a cavity on one side of each of said first and second substrates; placing an electrode material or a material that can be converted into an electrode material, for example, a silver or gold paste, in the cavity of each of the first and second substrates; and placing p- and n-type thermoelectric elements in contact with the electrode material in each of said first and second glass substrates; sealing the first and second substrates together with a sealing agent (for example, an inorganic binder or devitrifying frit) to form a thermoelectric module in which the p- and n-type thermoelectric elements and electrode material are within the module; heating and ceramming the module to thereby form glass-ceramic substrates, cure, when necessary, the electrode material to form electrodes and seal the module; and placing electrical leads in contact with the module to conduct electricity generated by the module to an electrical storage device.

In yet another embodiment, in either of the foregoing methods described above, one of the first or second substrates has a cavity formed on both sides (a first and a second cavity); one cavity (the first cavity) being filled with the electrode material and used to form the thermoelectric module as described above and the other cavity (the second cavity) being sealed to a third substrate having a cavity on one side to form a cooling path integrated into the thermoelectrical module for cooling one side of the thermoelectric module.

BRIEF DESCRIPTION OF THE DRAWINGS

FIG. 7 illustrates two thermoelectric modules of the invention sharing a common water circuit cooling base.

FIGS. 8A and 8B is an illustration show a first view and side view of a glass-ceramic thermoelectric module according to the invention.

DETAILED DESCRIPTION

Figure 1:
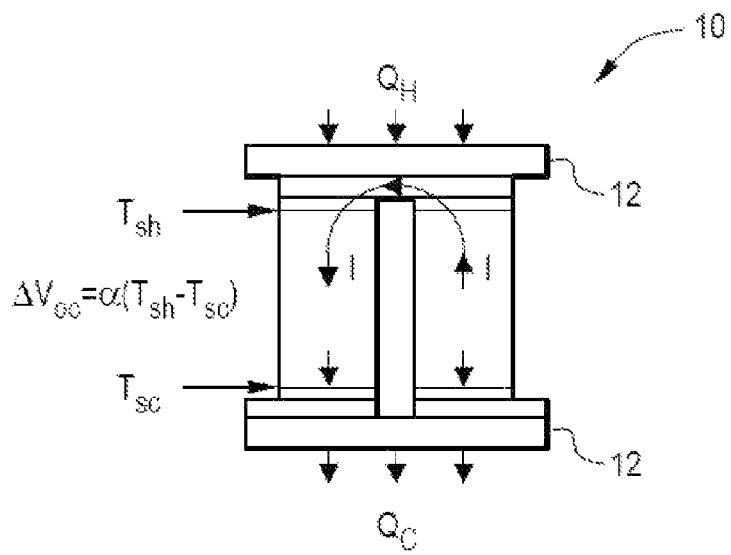
FIG. 1 is a simplified drawing of a thermoelectric module illustrating energy flow through a thermoelectric couple, with $Q_H$ and $Q_C$ representing heat input and output flows, respectively.
Figure 2:
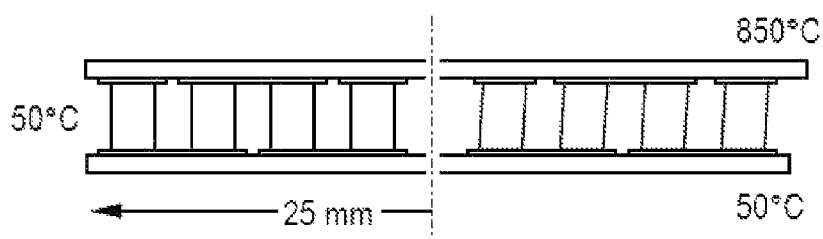
FIG. 2 is an illustration of a conventional thermoelectric module (right side) showing the thermal mismatch and a thermoelectric module of the invention (left side) in which there is negligible thermal mismatch.

The thermoelectric module architecture of the invention relies on the use of a low coefficient of thermal expansion material to prevent destructive thermo-mechanical stresses generally appearing between hot and cold sides of the module. It is to be understood that the CTE of the materials used in practicing the invention can be varied according to the temperature gradient changes which the module will experience during operation. For example, if it is known that in its operating environment the module will experience a the thermal gradient of 500° C., then the CTE can be larger that it would be if the operating environment were 800° C.

In accordance with the invention, one can make a thermoelectric module using glass-ceramic materials. This enables one to use glass sheet manufacturing and assembly process, and produce a material having a low thermal expansion coefficient state after ceramization. The ceramization can be carried out either after the thermoelectric module is completely assembled; or it can be carried out after the glass plate is formed according to the invention, but before the electrode material, for example, a silver paste, is applied. The present invention includes other low CTE materials such as silica, ULE, cordierite, aluminium titanate, silicon carbide or nitride and low CTE metallic alloys, for example, Invar from Imphy (17, rue Fournier, 92110 Clichy, France). Silver paste is used as a non-limiting exemplary material for the electrodes, and other materials such as gold, platinum, palladium, platinum/palladium alloys, and silver coated copper or nickel, and other materials that can survive exposure to temperatures up to approximately 1000° C. can also be used in practicing the invention.

To practice the invention one can use a glass-ceramic material that is chemically resistant to any "exhaust" or "waste" gases or oxidation at the temperatures to which the glass-ceramic may be exposed. In addition, the glass-ceramic material should have coefficient of thermal expansion ("CTE") of $<10\times10^{-7}/°$ C.; that is, a coefficient of thermal expansion $<10\times10^{-7}/°$ C. in the temperature range 20° C. to 700° C. In another embodiment the CTE is $<5\times10^{-7}/°$ C. in the temperature range 20° C. to 700° C. In a further embodiment the CTE is $<3\times10^{-7}/°$ C. in the temperature range 20° C. to 700° C. That is, any glass-ceramic material can be used in practicing the invention provided that the thermal shock resistance is high, greater than 500-700° C., and the transmittance in the IR range is sufficient high to achieve good heat transfer; for example, 1000 W/mK [thermal conductivity in "watt per meter Kelvin"]. Examples of such glass-ceramics include Keralite® (known as Pyroceram® III in North America) and Kerablack® (commercially available materials from Euro-Kera S.N.C of France).

Compositions described in U.S. Pat. No. 5,070,045 can be used in the glass-ceramic thermoelectric modules of this invention. These compositions contain, in weight percent ("wt. %"), 65-70% $SiO_2$, 18-19.8% $Al_2O_3$, 2.5-3.8% $Li_2O$, 0.55-1.5% MgO, 1.2-2.8% ZnO, 1.8-3.2% $TiO_2$, 0-1.4% BaO, 0-1.4% SrO,).4-1.4% BaO+SrO, 1.2-2.3% MgO+BaO+SrO, 1.0-2.5% $ZrO_2$, 0-1.5% $As_2O_3$, 0-1.5% $Sb_2O_3$, 0.5-1.5% $As_2O_3+Sb_2O_3$, 0-<1.0% $Na_2O$, 0-<1.0% $K_2O$, 0-<1.0% $Na_2O+K_2O$, and (2.8 $Li_2O$+1.2 ZnO)/5.5 MgO is >1.8; and optionally, the compositions can further contain one of 0.1-1.0% $V_2O_5$. CoO, $Cr_2O_3$, $Fe_2O_3$, $MnO_2$, and NiO. The crystalline phase of the glass ceramic can be any crystalline phase stable to temperatures up to approximately 1000° C.; for example β-quartz.

Figure 3:
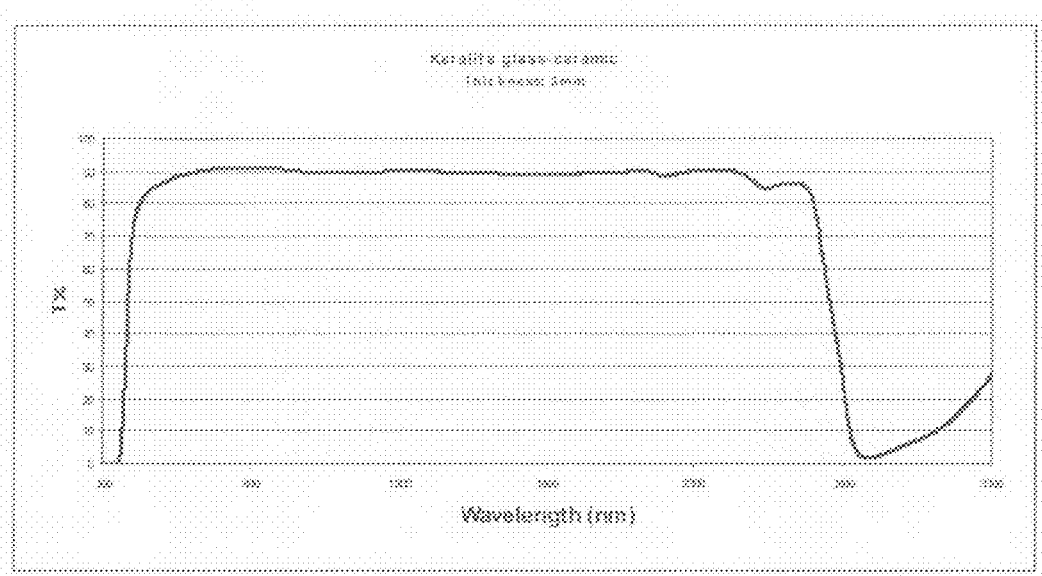
FIG. 3 is a graph of transmittance versus wavelength for Keralite® glass-ceramic.

To exemplify the invention the glass-ceramic material Keralite® was used to make the thermoelectric module of the invention. Keralite® has a number of optical, chemical and thermo-mechanical properties that make it suitable for use in thermoelectric modules was used to illustrate the invention. For example, this glass-ceramic can withstand thermal shocks as high as 700° C. without suffering any strength decline. In addition, even though its strength is lower compared to that of alumina, due to its very low thermal expansion Kerablack does not break under severe thermal gradients where alumina or nitride aluminium will fail. Kerablack's high oxidation resistance in air makes it suitable for operating at constant temperature up to 700° C. for extended periods of time and permit it to operate at temperature of up to the 800 for shorter periods. Further, Kerablack's transmission in the infrared portion of the spectrum is fairly high (90%), which allows for good heat transfer by the radiation mode at temperatures above 600° C. Transparent Keralite can also be used in practicing the invention. FIG. 3 shows the transmittance of transparent Keralite. The material in FIG. 3 appears transparent in the approximately 400-2500 nm wavelength range. Near infrared wavelengths conventionally begin at 800 nm, but heat belongs to the far infrared whose range is 3000-10,000 nm (3-10 μm). Finally, even allowing for the thermal conductivity of glass-ceramic being small compared to alumina or aluminium nitride at lower temperatures, it is still higher than that of usual thermoelectric materials and has a value of approximately 1.4 W/mK. As a consequence, if a sufficiently thin glass-ceramic (less than 1 mm, and preferably approximately 0.5 mm) is used, heat transfer will not be limited even at room temperature.

The thermal expansion of glass used to make the glass-ceramic before ceramization treatment is about $30\times10^{-7}/°$ C. This amorphous material can be worked in the same manner as other glasses; with the result that shaping the materials by pressing, rolling, bending and other methods used to shape glass can be done prior to the material being cerammed. Once the material is shaped, then a specific ceramization heat treatment is applied using temperatures in the range of 700-900° C. to promote the growing of crystals in order to lower thermal expansion of material. Estimations give seal stress of TE material/glass-ceramic of about 2 GPa caused by mismatch (800° C.). This stress level exceeds largely the modulus of rupture of both materials. However, the silver electrodes act (See FIG. 5) as an intermediate layer that accommodates stresses easily thanks to high ductility and low yield strength (7 MPa).

Glass-ceramic thermoelectric modules take advantage of the excellent IR radiative transmission of glass-ceramic hot electrode for direct, contact or non intimate contact hot source energy capture. Glass-ceramic compositions of the type described in U.S. Pat. No. 5,070,045, which also provides a typical ceramming schedule, can be used in practicing the present invention. Materials of this type are commercially available, for example the Keralite and Kerablack glass-ceramics cited elsewhere herein. The Keralite (or Pyroceram® III in North America) and Kerablack materials are excellent glass-ceramic materials for use in TE modules. These materials were especially developed and optimized for use as glass-ceramic cook tops. Table 2 compares the properties of Kerablack with alumina and aluminum nitride.

TABLE 2

Thermo-mechanical properties of selected materials

| | Kerablack ® | Alumina | Aluminum nitride |
|---|---|---|---|
| CTE ($\times 10^{-7}/°$ C.) at 300° C. | 0 | 85 | 46 |
| expansion over 25 mm for $\Delta T = 800°$ C. | <1 μm | 160 μm | 90 μm |
| Young's modulus (GPa) | 92 | 350 | 320 |
| MOR (MPa) | 220 | 300 | 290 |
| Thermal shock resistance (° C.) | >700 | 80 | 560 |
| Maximum use temperature in air (° C.) | 800° C. | 1700 | 1000 |
| Thermal conductivity (W/mK) | 2.2 | 28 | 175 |
| Volume resistivity (ohm · cm) at 25° C. | $10^{12}$ | $10^{15}$ | $>10^{14}$ |
| Chemical resistance | good | excellent | good |

Figure 6A:
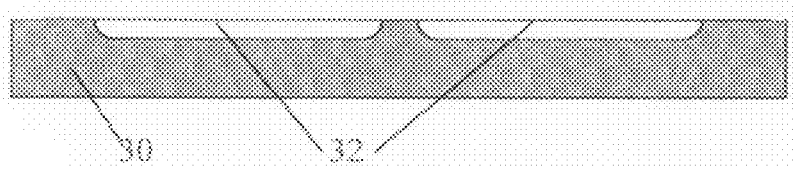
FIGS. 6A-6C is a simplified illustration of the manufacturing process for making a glass-ceramic thermoelectric module of the invention.
Figure 6B:
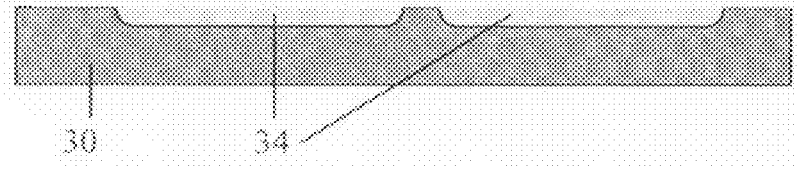
Figure 6C:
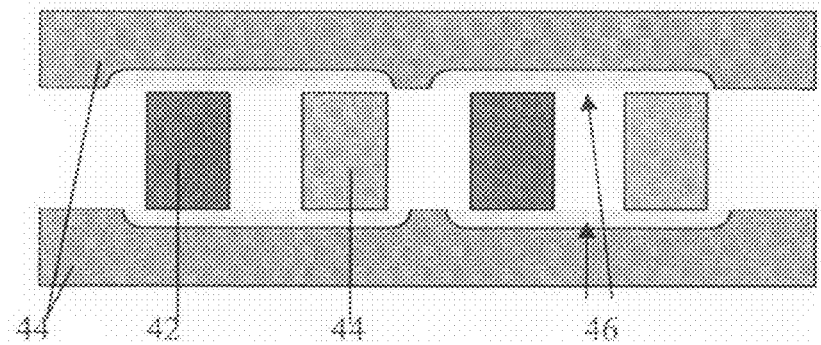
Figure 9:
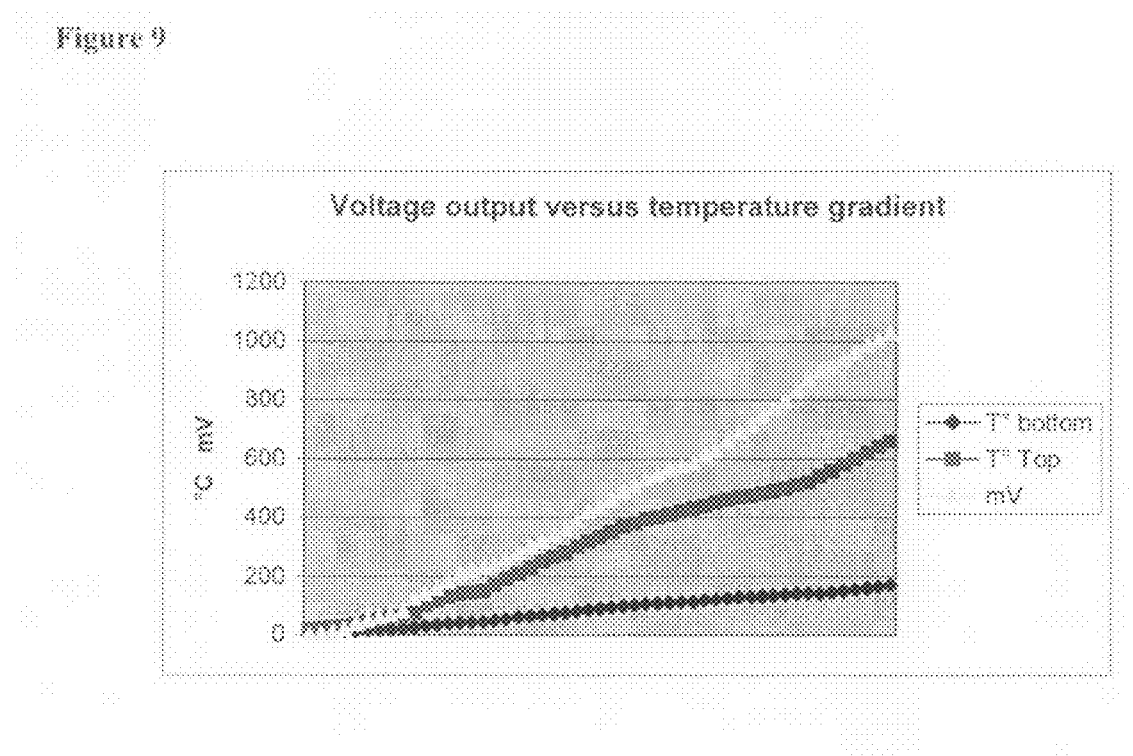
FIG. 9 is graph illustrating the output voltage of 6×6 glass-ceramic thermoelectric modules operating under a 450° C. thermal gradient.

FIGS. 6A to 6C illustrate an embodiment of the invention and the method of making the glass-ceramic TE module of the invention. FIG. 6A illustrates a glass electrode 30 that was roller plate molded before ceramization to form cavities with a depth 32 in the range of 0.15-0.4 mm (the cavities 32 are between the element 30 and line across the top of the element). Ceramization of the glass plate can be performed either before assembly of the module or at the end during the assembly cycle. For example, after molding to form cavities 32, the cavities 32 are filled with a silver electrode paste 34. In the subsequent step, as shown in FIG. 6C, p- and n-type thermoelectric element 40 and 42, respectively, are placed in contact with the silver paste in a first and a second electrode, the silver paste is cured according to the manufacturer's instructions and the entire assembly is the cerammed to convert the glass to glass-ceramic 44 and silver electrode 46. In an alternate embodiment the glass plate with cavities 32 is cerammed and the cavities are then filled with the silver electrode paste 34. Subsequently the p- and n-type thermoelectric elements 40 and 42, respectively, are placed in contact with the silver paste in a first and a second electrode and the silver paste is then cured according to the manufacturer's instructions; for example, curing (heat treating the paste at a temperature of 850° C. for one (1) minute. [The exact curing conditions, temperature and time, for may vary from paste type to paste type and from manufacturer to manufacturer. However, the electrode paste, whether silver or other material as described herein shown be capable of surviving exposure to temperatures up to approximately 1000° C.]

Figure 4:
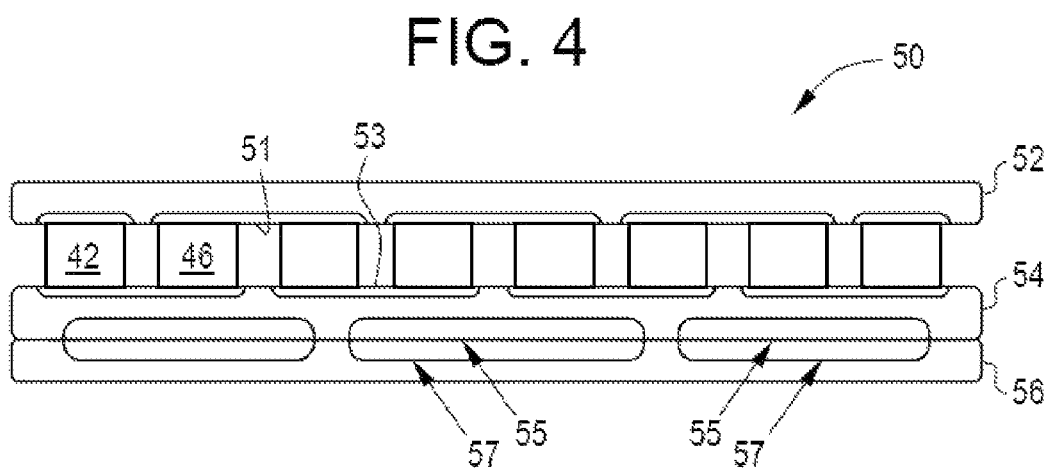
FIG. 4 is an illustration of a glass-ceramic thermoelectric module of the invention that has an integrated cold side water cooling jacket.

In another embodiment of the invention is illustrated in FIG. 4 in which the TE module 50 has an integrated cold side cooling water circuit. In FIG. 4 the first glass-ceramic substrate 52 has a plurality of cavities 51 on only one side which was filed with silver paste and placed in contact with the electrode material and with p- and n-elements 40 and 42, respectively. The second glass-ceramic substrate 54 has a plurality of first cavities 53 which was filed with silver paste and also placed in contact with elements 40 and 42, and the second substrate has a second substrate has a plurality of cavities 55 for use in the cooling water circuit. The second substrate 54 is mated to a third glass-ceramic substrate 56 that has a plurality of cavities 57 on one side such that cavities 55 and 57 together form the cooling water circuit for the cold side of the TE module. FIG. 7 illustrates a further embodiment in which a pair of TE modules is arranged on a common cooling base (see FIG. 4 for elements). FIGS. 8A and 8B are a first and side view, respectively, of a 4×3 array of assembled TE modules on a common cooling base (the positive and negative side on the TE assembly being indicated below each Figure). Each of the modules illustrated in FIGS. 8A and 8B is a 16×16 array of p- and n-type elements (8 of each per row/column).

The glass-ceramic thermoelectric module of the invention is made by preparing a first and a second glass substrate is prepared; forming a cavity on one side of each of said first and second substrates; ceramming the glass substrates having the cavities to form a glass-ceramic substrate having the cavities; placing a silver paste in the cavity of each of the first and second substrates; and placing p- and n-type thermoelectric elements in contact with the silver paste in each of said first and second glass-ceramic substrates; sealing the first and second substrates together with a sealing agent to form a thermoelectric module in which the p- and n-type thermoelectric elements and silver paste are within the sealed module; heating the sealed module to cure the silver paste to form silver electrodes or to bond elements to electrode; and placing electrical leads in contact with the module to conduct electricity generated by the module to an electrical storage device. Examples of the sealing agents that can be used in practicing the invention include inorganic binders (for example, Ceramabond 618N from AREMCO Products Inc. and similar inorganic binding materials capable of withstanding temperatures up to 800° C. and preferably to 1000° C.), and devitrifying glass frits (for example, frits such as those that are described in U.S. Pat. No. 4,315,991 assigned to Corning Incorporated and similar frits that are capable of withstanding temperatures up to 800° C. and preferably to 1000° C. and have a CTE comparable to that of the glass-ceramic substrate being used).

In a further embodiment, the method comprising the steps of preparing first and second glass substrate; forming a cavity on one side of each of said first and second substrates; placing a silver paste in the cavity of each of the first and second substrates; and placing p- and n-type thermoelectric elements in contact with the silver paste in each of said first and second glass substrates; sealing the first and second substrates together with a sealing agent (for example, inorganic binders and devitrifying glass frits) to form a thermoelectric module in which the p- and n-type thermoelectric elements and silver paste are within the module; heating and ceramming the module to thereby form glass-ceramic substrates, cure the silver paste to form silver electrodes or to bond elements to electrode and seal the module; and placing electrical leads in contact with the module to conduct electricity generated by the module to an electrical storage device.

In yet another embodiment, in either of the foregoing methods described in the two paragraphs, one of the first or second substrates has a cavity formed on both sides; one cavity being filled with the silver paste and used to form the thermoelectric module as described above and the other cavity being sealed to a third substrate having a cavity on one side to form a cooling path integrated into the thermoelectrical module as described above with reference to FIGS. 4, 7 and 8A and 8B.

Figure 5:
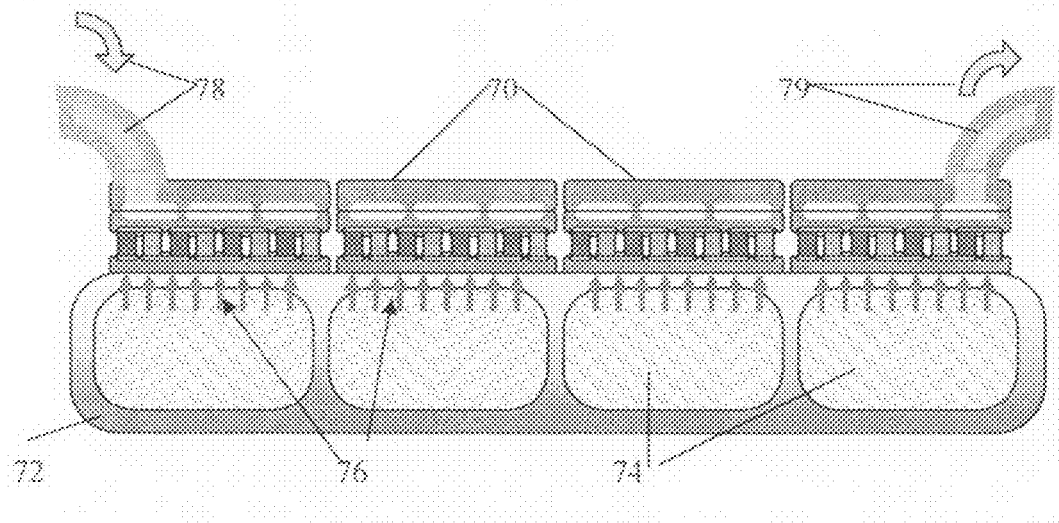
FIG. 5 is an illustration showing a cross section of a glass-ceramic thermoelectric module of the invention generating electrical power from an engine hot exhaust pipe manifold.

While the glass-ceramic thermoelectrical module of the invention can be used with both stationary and mobile engines, for illustration purposes the module will be discussed in terms of automotive applications. In an automobile engine the hottest temperature point in located just after combustion chambers, in exhaust pipe (see FIG. 5, a simplified illustration of an exhaust manifold with TE modules and associated integrated cooling in place; the large openings 74 are the manifold itself). To maximize recovery of the energy now being wasted by the exhaust gases, the thermoelectric module be located as close to the maximum temperature point as possible. The exhaust gases exit the cylinder into an exhaust manifold, which is typically cast iron, whose temperature typically ranges from 300° C. to 800° C. with forced or natural speed venting, and can reach 800° C. to 1000° C. if the venting is controlled (restricted). Hot exhaust gas thermal flux is radiatively communicated to the hot side of the silver electrode, then to thermoelectric elements, establishing the expected thermal gradient and generating the electrical voltage which is then routed through electrical connections (not illustrated) for use by the vehicle and it associated electrical components. The cold side is cooled by the engine cooling system trough the integrated vitroceramic circuit. In FIG. 5 a plurality of TE modules 70 (see discussion of FIGS. 6A-6C and FIG. 4) are mounted on an exhaust manifold 72. The hot exhaust gases 74 in the interior of the manifold 72 radiatively heat (arrows 76) the silver electrodes of the TE module and the heat is converted to electrical energy by the p- and n-type elements of the module. The engine cooling fluid is circulated (coolant in is element 78 and coolant out is element 79) through the cooling element of the module 70 which is described above in reference to FIG. 4.

The thermoelectric elements, the p- and n-type elements, are advantageously composed of metal oxide materials that are able to withstand the extreme temperatures encountered by contact with the exhaust without any degradation and maintain good thermoelectric properties in that temperature domain. That is, the p- and n-type should be able to withstand temperatures up to 1000° C. Examples of n- and p-type oxides that can be used in practicing the invention are manganite and cobaltite.

1. Cobaltite, $Ca_3CO_4O_9$, control by $Ca_3/Co_4$ ratio; and similar p-type materials that can withstand temperatures up to 1000° C. and meet the CTE criteria set forth herein.
2. Perovskites $AMO_3$ (n-type): for example manganite, $Ca_{0.95}Sm_{0.05}MnO_3$, and similar n-type materials that can withstand temperatures up to 1000° C. and meet the CTE criteria set forth herein.

Perovskites are so named after the mineral perovskite ($CaTiO_3$) and have the general formula $AMO_3$, where A is a large cation (e.g., $Ca^{+2}$), M is a small cation (e.g., $Ti^{+4}$) and O is the oxide ion ($O^{-2}$). The large cation and oxide ions form a cubic close packed array with the smaller cation occupying those octahedral holes formed exclusively by the oxide ions. N-type materials have are those which contain "impurities" (Sm in the example above) that contribute free electrons, thus greatly increasing the conductivity of the material. P-type materials are those that contain "impurities" to create a deficiencies of valence electrons that are called "holes". In a p-n circuit, electron flow is from the n-type material to the p-type material. Other n- and p-type metal oxides known in the art can also be used in practicing the invention. For example, additional $AMO_3$ type materials include $CaTiO_3$, $SrTiO_3$, $BaTiO_3$, $LaMnO_3$, $MgSiO_3$, and similar materials known in the art that meet the criteria set forth herein. The p- and n-type materials should have a CTE comparable to those of the glass-ceramics with which they are used. Generally, this is a CTE of $<10 \times 10^{-7}$/° C.; preferably less than $<5 \times 10^{-7}$/° C.; and more preferably $<3 \times 10^{-7}$/° C.

The thermoelectric is module architecture and employed materials described herein can be exposed to any temperature up to 900° C. without thermal shock hazard. In addition, the module minimizes the number of pieces and thus thermal interfaces. The hot side mechanical independency prevents cast iron expansion/contraction that can build mechanical stresses into modules. The cold side cooling chamber integration allows easy, non-invasive module integration in most existing automotive engines, by a deviation of the cooling circuit. In addition, the use of metal oxides as thermoelectric materials presents goods high temperature thermoelectric performance domain. The metal oxides do not suffer from the need for a 20° C. cold source such as is required for bismuth telluride. If a 20° C. cold source was necessary, this would require energy for cooling the water or it would be necessary to use with air and fans to make the module work, which would also require energy.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

We claim:

1. A thermoelectric module for generating electrical energy from a hot gaseous heat source, said module comprising:
   a first glass-ceramic substrate having a cavity on one side thereof,
   a second glass-ceramic substrate having a plurality of first cavities on one side and a plurality of second cavities on the opposing side thereof, and
   a third glass-ceramic substrate having a plurality of cavities on one side thereof;
   ductile electrodes within said first glass-ceramic plurality of cavities and within said second glass-ceramic first plurality of cavities, the electrodes being in contact with each of said substrates, and
   one or a plurality of pairs of p- and n-type materials in contact with the electrodes of the first glass-ceramic substrate and the second glass-ceramic substrate;
   the second glass-ceramic substrate and the third glass-ceramic substrate are mated and joined together using a sealing agent to form a circuit for cooling water between the second and third substrate cavities; and
   electrical leads from said module to an electrical device;
   wherein when one side of the module is subjected to and in contact with a gaseous heat source, said heat source being at a temperature of up to 1000° C., and the other side of said module is subjected to cooling through the cooling circuit, electrical power is generated by conversion of heat energy from said hot gaseous heat source to electrical energy by heat transfer from said hot gaseous heat source to said pairs p- and n-type materials which thereby convert said heat energy to electrical energy; and
   wherein said glass-ceramic substrate has a coefficient of thermal expansion of $<10 \times 10^{-7}$/° C. at temperatures in the range of 20-700° C.

2. The thermoelectric module according to claim 1, wherein said p-type material is a p-type oxide thermoelectric materials known in the art that survive temperatures up to 1000° C. in air and has a CTE of $<10 \times 10^{-7}$/° C.

3. The thermoelectric module according to claim 1, wherein said n-type material is selected from the group consisting of an $AMO_3$ perovskite and other n-type oxide thermoelectric materials known in the art that survive temperatures up to 1000° C. in air and has a CTE of $<10 \times 10^{-7}/$° C.

4. The thermoelectric module according to claim 1, wherein said p-type material is Ca3Co4O9 and said perovskite is $Ca_{0.95}Sm_{0.05}MnO_3$.

5. The thermoelectric module according to claim 1, wherein the coefficient of thermal expansion of said substrate and said p- and n-type materials is $<5 \times 10^{-7}/$° C. at temperatures in the range of 20-700° C.

6. The thermoelectric module according to claim 1, wherein said ductile electrode is a conductive material that can survive temperatures up to approximately 1000° C.

7. The thermoelectric module according to claim 6, wherein said ductile electrode is selected from the group consisting of silver, gold, platinum, palladium, silver coated copper or nickel, and platinum/palladium alloy electrodes; and electrodes made of other materials that can survive exposure to temperatures up to approximately 1000° C.

8. The module according to claim 1, wherein the composition of the glass-ceramic, in weight percent, consists essentially of 65-70% $SiO_2$, 18-19.8% $Al_2O_3$, 2.5-3.8% $Li_2O$, 0.55-1.5% MgO, 1.2-2.8% ZnO, 1.8-3.2% $TiO_2$, 0-1.4% BaO, 0-1.4% SrO,).4-1.4% BaO+SrO, 1.2-2.3% MgO+BaO+SrO, 1.0-2.5% $ZrO_2$, 0-1.5% $As_2O_3$, 0-1.5% $Sb_2O_3$, 0.5-1.5% $As_2O_3+Sb_2O_3$, 0-<1.0% $Na_2O$, 0-<1.0% $K_2O$, 0-<1.0% $Na_2O+K_2O$, and $(2.8Li_2O+1.2ZnO)/5.5MgO$ is >1.8; and, optionally, may further consist of 0.1-1.0% of one oxide selected from the group consisting of $V_2O_5$, CoO, $Cr_2O_3$, $Fe_2O_3$, $MnO_2$ and NiO.

9. A method of making a thermoelectric module utilizing a glass-ceramic substrate, said method comprising the steps of:
preparing a first, a second and a third glass substrate having a composition such that after said glass is cerammed to form a glass-ceramic, said glass-ceramic has a coefficient of thermal expansion $<10 \times 10^{-7}/$° C. at temperatures in the range of 20-700° C.,
forming said first, second and third substrates such that:
the first glass-ceramic substrate has a cavity on one side thereof,
the a second glass-ceramic substrate has a plurality of first cavities on one side and a plurality of second cavities on the opposing side thereof, and
a third glass-ceramic substrate having a plurality of cavities on one side thereof;
providing a ductile electrode material in the cavities of the first substrate and the first cavities of the second substrates;
placing p- and n-type thermoelectric elements in contact with the electrode or electrode material in each of said first and second glass-ceramic substrates;
mating and joining together the second glass-ceramic substrate and the third glass-ceramic substrate using a sealing agent to form a circuit for cooling water;
sealing the first and second substrates together with a sealing agent to form a thermoelectric module in which the p- and n-type thermoelectric elements and silver paste are within the sealed module;
heating the sealed module to cure the electrode forming material; and
placing electrical leads in contact with the module to conduct electricity generated by the module to an electrical storage device;
wherein said glass substrate is cerammed after forming the cavity in the first and second substrate, or after the module is heated to cure the electrode material to form the electrodes, to form a glass-ceramic substrate having a coefficient of thermal expansion $<10 \times 10^{-7}/$° C. at temperatures in the range of 20-700° C.

10. The method according to claim 9, wherein after ceramming the glass ceramic substrate has a coefficient of thermal expansion of $<5 \times 10^{-7}/$° C.

11. The method according to claim 9, wherein providing a ductile electrode or electrode forming material means providing a material selected from the consisting of silver, gold, platinum, palladium, silver coated copper or nickel, and platinum/palladium alloy electrodes; and electrodes made of other materials that can survive exposure to temperatures up to approximately 1000° C.

12. The method according to claim 9, wherein regarding
(a) the first and second substrate together containing the p- and n-type materials and the electrodes, and
(b) the third substrate and the substrate having the second cavity;
each of (a) and (b) sealed together using an inorganic binder or a devitrifying frit.

13. The method according to claim 1, wherein the sealing agent is selected from the group consisting of an inorganic binder or a devitrifying frit.

* * * * *